United States Patent
Tan et al.

(10) Patent No.: US 12,067,347 B2
(45) Date of Patent: Aug. 20, 2024

(54) SENTENCE GENERATION METHOD AND APPARATUS, DEVICE, AND STORAGE MEDIUM

(71) Applicant: TENCENT TECHNOLOGY (SHENZHEN) COMPANY LIMITED, Shenzhen (CN)

(72) Inventors: Yizhang Tan, Shenzhen (CN); Jiachen Ding, Shenzhen (CN); Changyu Miao, Shenzhen (CN)

(73) Assignee: TENCENT TECHNOLOGY (SHENZHEN) COMPANY LIMITED, Shenzhen (CN)

( * ) Notice: Subject to any disclaimer, the term of this patent is extended or adjusted under 35 U.S.C. 154(b) by 569 days.

(21) Appl. No.: 17/230,985

(22) Filed: Apr. 14, 2021

(65) Prior Publication Data

US 2021/0232751 A1    Jul. 29, 2021

Related U.S. Application Data

(63) Continuation of application No. PCT/CN2020/073407, filed on Jan. 21, 2020.

(30) Foreign Application Priority Data

Jan. 24, 2019    (CN) .......................... 201910068987.3

(51) Int. Cl.
*G06F 40/20* (2020.01)
*G06F 40/12* (2020.01)
(Continued)

(52) U.S. Cl.
CPC ............ *G06F 40/12* (2020.01); *G06F 40/253* (2020.01); *G06F 40/289* (2020.01); *G06N 3/084* (2013.01);
(Continued)

(58) Field of Classification Search
None
See application file for complete search history.

(56) References Cited

U.S. PATENT DOCUMENTS 7,225,120 B2 * 5/2007 Kawatani .............. G06F 16/345
707/E17.084
9,881,082 B2 * 1/2018 Krishnamurthy ....... G06F 40/30
(Continued)

FOREIGN PATENT DOCUMENTS

CN    1790332 A    6/2006
CN    104778256 A    7/2015
(Continued)

OTHER PUBLICATIONS

IP.com machine translation of CN109145099A. (Year: 2019).*
(Continued)

*Primary Examiner* — Richard Z Zhu
(74) *Attorney, Agent, or Firm* — ANOVA LAW GROUP, PLLC

(57) ABSTRACT

A sentence generation method is provided for an electronic device. The method includes obtaining an input sequence, encoding the input sequence to obtain a sentence eigenvector, decoding the sentence eigenvector to obtain a first predetermined quantity of candidate sentence sequences, clustering the first predetermined quantity of candidate sentence sequences to obtain sentence sequence sets of at least two types, screening out a second predetermined quantity of candidate sentence sequences from the sentence sequence sets of at least two types, the second predetermined quantity of candidate sentence sequences including at least two sentence feature types, and determining an output sequence corresponding to the input sequence according to the second predetermined quantity of candidate sentence sequences.

16 Claims, 9 Drawing Sheets

(51) Int. Cl.
*G06F 40/253* (2020.01)
*G06F 40/289* (2020.01)
*G06N 3/084* (2023.01)
*G10L 15/22* (2006.01)
*G06F 40/205* (2020.01)
*G06F 40/40* (2020.01)
*G06F 40/56* (2020.01)

(52) U.S. Cl.
CPC ............ *G06F 40/205* (2020.01); *G06F 40/40* (2020.01); *G06F 40/56* (2020.01); *G10L 15/22* (2013.01)

(56) References Cited

U.S. PATENT DOCUMENTS

| | | | |
|---|---|---|---|
| 9,886,501 B2* | 2/2018 | Krishnamurthy | G06F 16/345 |
| 9,910,886 B2* | 3/2018 | Adams, Jr. | G06F 16/2423 |
| 10,579,725 B2* | 3/2020 | de Mello Brandao | G06F 40/253 |
| 10,706,236 B1* | 7/2020 | Platt | G06F 16/3344 |
| 10,867,136 B2* | 12/2020 | Lee | G06F 40/58 |
| 10,902,216 B2* | 1/2021 | Lee | G06N 3/08 |
| 11,036,941 B2* | 6/2021 | Moss | G06F 16/24558 |
| 11,620,449 B2* | 4/2023 | Li | G06F 17/16 704/9 |
| 2009/0157380 A1* | 6/2009 | Kim | G06F 40/53 704/4 |
| 2011/0246465 A1 | 10/2011 | Koister et al. | |
| 2017/0323204 A1 | 11/2017 | Akbulut et al. | |
| 2018/0011843 A1* | 1/2018 | Lee | G06F 40/56 |
| 2019/0138613 A1* | 5/2019 | Adada | G06F 40/258 |
| 2019/0294678 A1* | 9/2019 | Sapugay | G06F 40/211 |

FOREIGN PATENT DOCUMENTS

| | | | | |
|---|---|---|---|---|
| CN | 107368547 A | | 11/2017 | |
| CN | 109145099 A | * | 1/2019 | ............ G06F 40/30 |
| CN | 109145099 A | | 1/2019 | |
| CN | 110162604 A | | 8/2019 | |

OTHER PUBLICATIONS

The World Intellectual Property Organization (WIPO) International Search Report for PCT/CN2020/073407 Apr. 17, 2020 6 Pages (including translation).

* cited by examiner

SENTENCE GENERATION METHOD AND APPARATUS, DEVICE, AND STORAGE MEDIUM

RELATED APPLICATION(S)

This application is a continuation application of PCT Patent Application No. PCT/CN2020/073407, filed on Jan. 21, 2020, which claims priority to Chinese Patent Application No. 2019100689873, entitled "SENTENCE GENERATION METHOD AND APPARATUS, DEVICE, AND STORAGE MEDIUM" and filed with the National Intellectual Property Administration, PRC on Jan. 24, 2019, all of which are incorporated herein by reference in entirety.

FIELD OF THE TECHNOLOGY

The present disclosure relates to the field of artificial intelligence, and in particular, to a sentence generation method and apparatus, a device, and a storage medium.

BACKGROUND

A sentence generation method may be used in any functional dialog system, machine translation system, question answering system, automatic writing system, and reading comprehension system, and may be suitable for a dialog system that requires a large information amount and diversity.

The sentence generation method based on deep learning is in current development. After a sentence sequence inputted by a user is obtained, a method for generating an output sequence may include encoding the inputted sentence sequence into a vector and decoding the vector to obtain the output sequence.

In the process of generating the output sequence, the foregoing method may not effectively process the inputted sentence sequence, resulting in insufficient accuracy of the generated sentence.

SUMMARY

According to various embodiments provided in the present disclosure, a sentence generation method and apparatus, a device, and a storage medium are provided. The specific technical solutions are described as follows:

In one aspect, the present disclosure provides a sentence generation method, performed by an electronic device. The method includes: obtaining an input sequence; encoding the input sequence to obtain a sentence eigenvector, the sentence eigenvector being the representation of the input sequence; decoding the sentence eigenvector to obtain a first predetermined quantity of candidate sentence sequences; clustering the first predetermined quantity of candidate sentence sequences to obtain sentence sequence sets of at least two types; screening out a second predetermined quantity of candidate sentence sequences from the sentence sequence sets of at least two types, the second predetermined quantity of candidate sentence sequences including at least two sentence feature types, the second predetermined quantity being less than the first predetermined quantity; and determining an output sequence corresponding to the input sequence according to the second predetermined quantity of candidate sentence sequences.

In another aspect, the present disclosure provides a sentence generation apparatus. The apparatus includes a memory storing computer program instructions; and a processor coupled to the memory and configured to executing the computer program instructions and perform: obtaining an input sequence; encoding the input sequence to obtain a sentence eigenvector, the sentence eigenvector being the representation of the input sequence; decoding the sentence eigenvector to obtain a first predetermined quantity of candidate sentence sequences; clustering the first predetermined quantity of candidate sentence sequences to obtain sentence sequence sets of at least two types; screening out a second predetermined quantity of candidate sentence sequences from the sentence sequence sets of at least two types, the second predetermined quantity of candidate sentence sequences including at least two sentence feature types, the second predetermined quantity being less than the first predetermined quantity; and determining an output sequence corresponding to the input sequence according to the second predetermined quantity of candidate sentence sequences.

In yet another aspect, the present disclosure provides a non-transitory computer-readable storage medium storing computer program instructions executable by at least one processor to perform: obtaining an input sequence; encoding the input sequence to obtain a sentence eigenvector, the sentence eigenvector being the representation of the input sequence; decoding the sentence eigenvector to obtain a first predetermined quantity of candidate sentence sequences; clustering the first predetermined quantity of candidate sentence sequences to obtain sentence sequence sets of at least two types; screening out a second predetermined quantity of candidate sentence sequences from the sentence sequence sets of at least two types, the second predetermined quantity of candidate sentence sequences including at least two sentence feature types, the second predetermined quantity being less than the first predetermined quantity; and determining an output sequence corresponding to the input sequence according to the second predetermined quantity of candidate sentence sequences Details of one or more embodiments of the present disclosure are provided in the accompanying drawings and descriptions below. Based on the description, the accompanying drawings, and the claims of the present disclosure, other features, objectives, and advantages of the present disclosure become more obvious.

BRIEF DESCRIPTION OF THE DRAWINGS

To more clearly describe technical solutions of certain embodiments of the present disclosure, accompanying drawings are described below. The accompanying drawings are illustrative of embodiments of the present disclosure, and a person of ordinary skill in the art may still derive other drawings from these accompanying drawings without having to exert creative efforts. When the following descriptions are made with reference to the accompanying drawings, unless otherwise indicated, same numbers in different accompanying drawings represent same or similar elements. In addition, the accompanying drawings are not necessarily drawn to scale.

DESCRIPTION OF EMBODIMENTS

Figure 1:
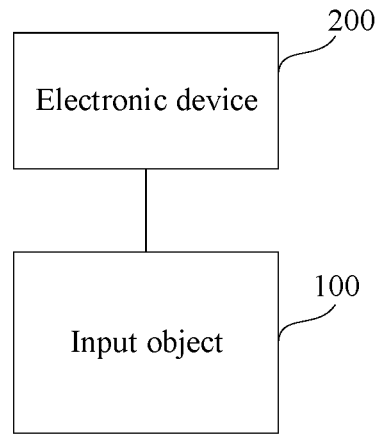
FIG. 1 is a schematic structural diagram of an implementation scenario according to one or more embodiments of the present disclosure.

To make objectives, technical solutions, and advantages of the present disclosure clearer and more comprehensible, certain embodiments of the present disclosure are further elaborated in detail with reference to the accompanying drawings. The described embodiments are not to be construed as a limitation to embodiments of the present disclosure. All other embodiments obtained by a person of ordinary skill in the art without creative efforts shall fall within the protection scope of embodiments of the present disclosure.

Throughout the description, "some embodiments" or "certain embodiments" describe subsets of all possible embodiments, but it may be understood that the "some embodiments" or "certain embodiments" may be the same subset or different subsets of all the possible embodiments, and can be combined with each other without conflict.

In certain embodiments of the present disclosure, the term "based on" is employed herein interchangeably with the term "according to."

In certain embodiments of the present disclosure, the term "decoding" may refer to a process of generating a sentence verbatim according to input data in natural language processing.

In certain embodiments of the present disclosure, the term "clustering" may refer to a process of clustering a plurality of pieces of data into sets of at least two different types by using a clustering algorithm.

In certain embodiments of the present disclosure, the clustering algorithm includes at least one of a K-means clustering algorithm, a mean shift clustering algorithm, a density-based clustering algorithm, an expectation maximization clustering algorithm with a Gaussian mixture model, and an agglomerative hierarchical clustering algorithm.

In certain embodiments of the present disclosure, the term "sentence scoring model" may refer to a mathematical model used for determining, according to an inputted sentence sequence, a sentence score of the sentence sequence.

In certain embodiments of the present disclosure, the sentence scoring model is used for measuring whether a sentence sequence is a natural language.

In certain embodiments of the present disclosure, the sentence scoring model may include at least one of a deep neural network (DNN) model, a recurrent neural network (RNN) model, an embedding model, a gradient boosting decision tree (GBDT) model, a logistic regression (LR) model.

In certain embodiments of the present disclosure, the DNN model is a deep learning framework. The DNN model includes an input layer, at least one hidden layer (or referred to as a middle layer), and an output layer. Optionally, each of the input layer, the at least one hidden layer (or referred to as the middle layer), and the output layer includes at least one neuron, and the neuron is used for processing received data. Optionally, different layers may have the same quantity of neurons or may have different quantities of neurons.

In certain embodiments of the present disclosure, the RNN model is a neural network having a feedback structure. In the RNN model, an output of a neuron may directly act on the neuron itself at a next time stamp. That is, an input of an $i^{th}$ layer neuron at a moment m includes both an output of an $(i-1)^{th}$ layer neuron at the moment and an output of the $i^{th}$-layer neuron at a moment m−1.

In the embedding model, based on a distributed vector representation of an entity and a relation, a relation in each triplet instance is considered as a translation from an entity head to an entity tail. The triplet instance includes a subject, a relation, and an object. The triplet instance may be represented as (subject, relation, object). The subject is an entity head, and the object is an entity tail. For example, Smith Senior is Smith Junior's father, and a triplet instance is represented as (Smith Junior, Father, Smith Senior).

In certain embodiments of the present disclosure, the GBDT model may refer to an iterative decision tree algorithm. The algorithm is formed by a plurality of decision trees. Results of all the trees are added to form an eventual result. Each node of a decision tree obtains a predicted value. Age is used as an example. The predicted value is an average age value of all the people that belong to a node corresponding to age.

In certain embodiments of the present disclosure, the LR model may refer to a model established by using a logic function based on linear regression.

In certain embodiments of the present disclosure, the term "beam search" may refer to a heuristic image search algorithm. In a decoding process of a natural language, the beam search is a process of searching a currently obtained sentence sequence set (also referred to as a sentence beam) to obtain a finally-generated output sequence.

In certain embodiments of the present disclosure, the term "beams size (BS)" may refer to a quantity for limiting the sentence beams in the beam search algorithm.

Certain existing decoding technologies may be based on the beam search, and may not reflect differences in sentence contents. Therefore, many candidate sentence sequences tend to be in the same type after a plurality of times of decoding, and are usually safe output sequences, that is, grammatical output sequences with a lack of information, for example, "ho-ho" and "right".

One or more embodiments of the present disclosure provide a sentence generation method and apparatus, a device, and a storage medium. An input sequence is encoded to obtain a sentence eigenvector, the sentence eigenvector is decoded to obtain a first predetermined quantity of candidate sentence sequences, and the first predetermined quantity of candidate sentence sequences are clustered and screened to obtain a second predetermined quantity of candidate sentence sequences, so that the generated candidate sentence sequences include at least two sentence feature types. Therefore, an output sequence generated based on the second predetermined quantity of candidate sentence sequences has higher diversity, thereby avoiding the situation in the related art that all output sequences outputted by a dialog system are safe output sequences, effectively meeting needs of a user, and improving accuracy of sentence generation.

For ease of understanding of the technical solutions provided in the embodiments of the present disclosure, a schematic structural diagram of an implementation scenario according to an exemplary embodiment of the present disclosure is first described with reference to FIG. 1.

The implementation scenario includes an input object 100 and an electronic device 200 based on deep learning (electronic device for short below). The electronic device 200 is configured to execute the following sentence generation process: obtaining an input sequence of the input object 100, responding to the input sequence to generate an output sequence, and displaying the output sequence to the input object 100.

In certain embodiments, the input sequence is an inputted sentence sequence to be processed, and the output sequence is an outputted sentence sequence that has been processed.

In certain embodiments, the sentence generation method is applied to a dialog system, a machine translation system, a question answering system, an automatic writing system, or a reading comprehension system. The dialog system obtains, from the Internet or a local database, a reply sentence corresponding to a to-be-replied sentence inputted by a user. The machine translation system obtains, from the Internet or a local database, a translated sentence corresponding to a to-be-translated sentence inputted by a user. The question answering system obtains, from the Internet or a local database, an answer sentence corresponding to a question sentence inputted by a user. The automatic writing system obtains, from the Internet or a local database, a content sentence corresponding to a theme sentence for describing a theme inputted by a user. The reading comprehension system queries a reading material provided by a user to obtain an answer sentence corresponding to a topic sentence inputted by the user.

When or in response to determining that the sentence generation method is applied to a dialog system, the input sequence is a to-be-replied sentence, and the output sequence is a reply sentence.

When or in response to determining that the sentence generation method is applied to a machine translation system, the input sequence is a to-be-translated sentence of a first language type, and the output sequence is a translated sentence of a second language type, the first language type being different from the second language type. For example, the first language type is English, and the second language type is Chinese.

When or in response to determining that the sentence generation method is applied to a question answering system, the input sequence is a question sentence, and the output sequence is an answer sentence.

When or in response to determining that the sentence generation method is applied to an automatic writing system, the input sequence is a theme sentence, and the output sequence is a content sentence.

When or in response to determining that the sentence generation method is applied to a reading comprehension system, the input sequence is a topic sentence, and the output sequence is an answer sentence.

In an implementation, the input object 100 may be a human, the electronic device 200 may be a terminal such as a mobile phone and a computer, and the foregoing sentence generation process is implemented between the human and the terminal.

In certain embodiments, a first application program is installed in the electronic device 200, and the first application program is an application program with a sentence generation function. For example, the first application program is an application program with functions such as question answering, automatic message replying, and machine translation.

For example, a user puts a question (an input sequence) to the first application program through text or voice input, and the first application program generates and displays an answer (an output sequence) according to the question of the user.

In another implementation, the input object 100 may be a client, the electronic device 200 may be a server, and the foregoing sentence generation process is implemented between the client and the server. The client includes, but is not limited to, a mobile phone, a computer, and the like. The server may provide different services. The server includes, but is not limited to, weather query, service consultation, smart customer service (used for air ticket service, restaurant service, or the like), and the like.

Figure 2:
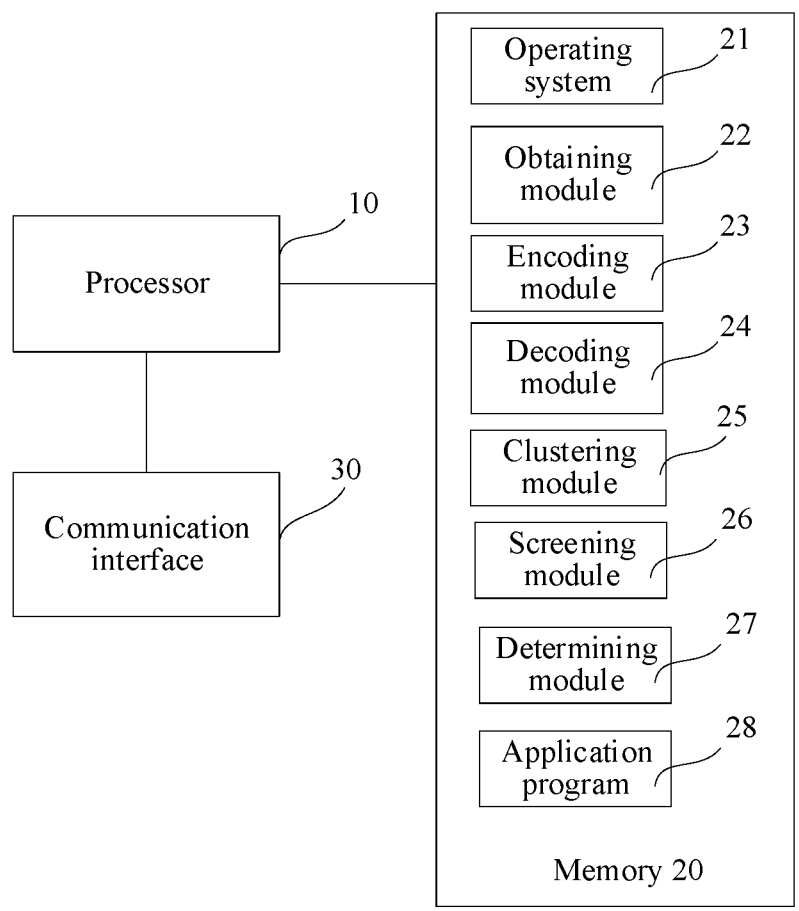
FIG. 2 is a schematic diagram of a hardware structure of an electronic device according to one or more embodiments of the present disclosure.

FIG. 2 is a schematic structural diagram of an electronic device according to an exemplary embodiment of the present disclosure. As shown in FIG. 2, the electronic device includes one or more processors 10, a memory 20, and a communication interface 30. A person skilled in the art may understand that the structure shown in FIG. 2 does not constitute a limitation on the electronic device, and the electronic device may include more or fewer components than those shown in the figure, or some components may be combined, or different component deployments may be used.

The one or more processors 10 are a control center of the electronic device, and connect various parts of the entire electronic device by using various interfaces and lines. By running or executing a software program and/or a module stored in the memory 20, and invoking data stored in the memory 20, the processor performs various functions of the electronic device and processes data, thereby performing overall controlling on the electronic device. The one or more processors 10 may be implemented by a CPU, or may be implemented by one or more graphics processing units (GPUs).

The memory 20 may be configured to store a software program and a module. The one or more processors 10 run the software program and the module stored in the memory 20, to implement various functional applications and data processing. The memory 20 may include a program storage area and a data storage area. The program storage area may store an operating system 21, an obtaining module 22, an encoding module 23, a decoding module 24, a clustering module 25, a screening module 26, a determining module 27, an application program 28 required by at least one function (for example, neural network training), and the like. The data storage area may store data created according to use of the electronic device, and the like. The memory 20 may be implemented by using a volatile or non-volatile storage device of any type or a combination thereof, for example, a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a disk, or an optical disc. Correspondingly, the memory 20 may further include a memory controller, so that the one or more processors 10 can access the memory 20.

The one or more processors 10 run the obtaining module 22 to implement the following function: obtaining an input sequence. The one or more processors 10 run the encoding module 23 to implement the following function: encoding the input sequence to obtain a sentence eigenvector, the sentence eigenvector being the representation of the input sequence. The one or more processors 10 run the decoding module 24 to implement the following function: decoding the sentence eigenvector to obtain a first predetermined quantity of candidate sentence sequences. The one or more processors 10 run the clustering module 25 to implement the following function: clustering the first predetermined quantity of candidate sentence sequences to obtain sentence sequence sets of at least two types. The one or more processors 10 run the screening module 26 to implement the following function: screening out a second predetermined quantity of candidate sentence sequences from the sentence sequence sets of at least two types, the second predetermined quantity of candidate sentence sequences including at least two sentence feature types, the second predetermined quantity being less than the first predetermined quantity. The one or more processors 10 run the determining module 27 to implement the following function: determining an output sequence corresponding to the input sequence according to the second predetermined quantity of candidate sentence sequences.

Figure 3:
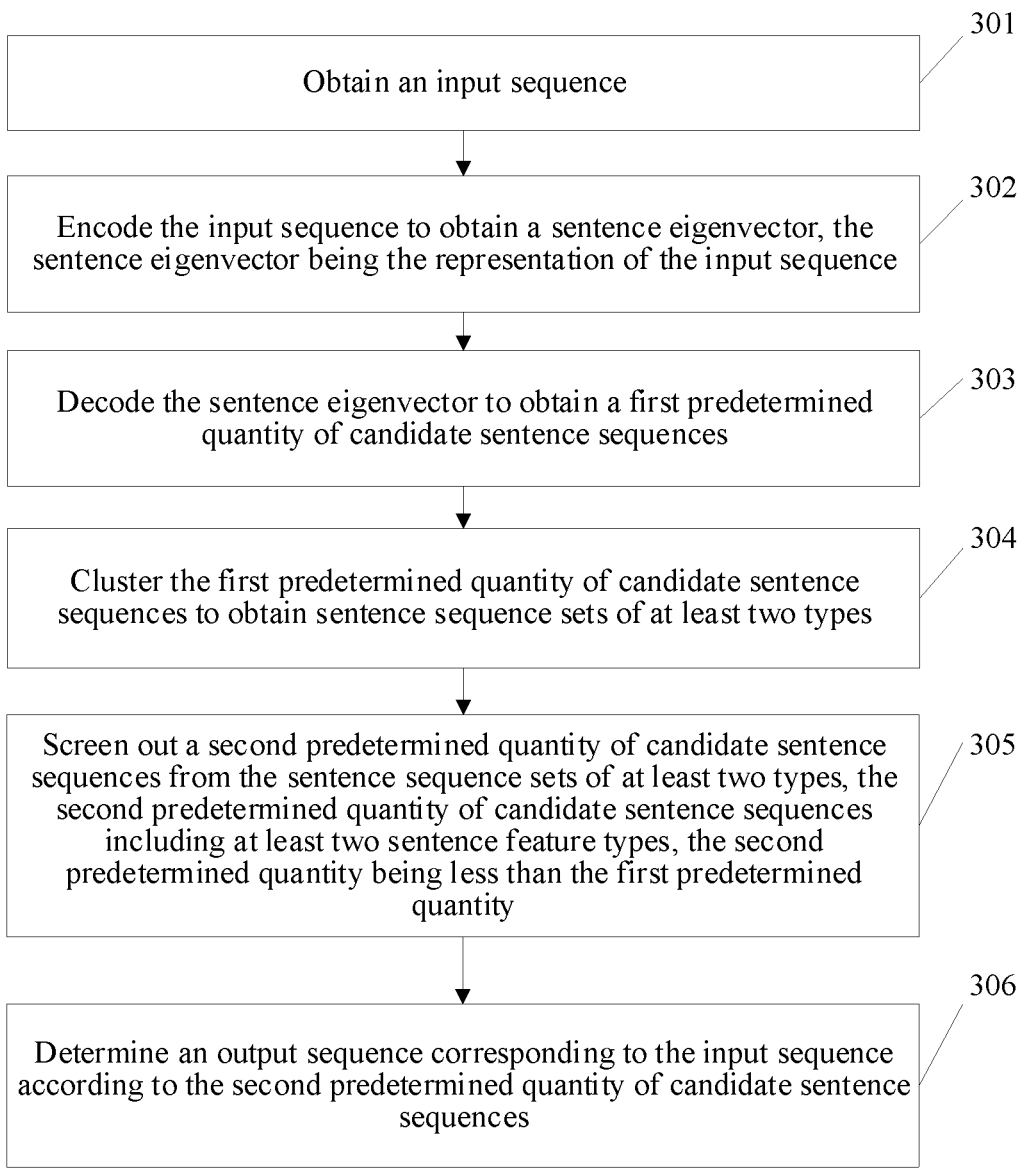
FIG. 3 is a flowchart of a sentence generation method according to one or more embodiments of the present disclosure.

FIG. 3 is a flowchart of a sentence generation method according to an exemplary embodiment of the present disclosure. The method may be implemented by using the electronic device in the foregoing application scenario. Referring to FIG. 3, the sentence generation method includes the following steps:

Step 301. Obtain an input sequence.

In certain embodiments, the input sequence is inputted text data, or is text data obtained by recognizing inputted voice data or picture data.

The electronic device obtaining the input sequence may include the following: the electronic device receives text data (words, phrases, or sentences) and determines the text data as the input sequence. Alternatively, the electronic device receives voice data, performs speech recognition on the voice data to obtain text data, and determines the text data obtained through the speech recognition as the input sequence. Alternatively, the electronic device receives picture data, performs optical character recognition on the picture data to obtain text data, and determines the text data obtained through the recognition as the input sequence.

Step 302. Encode the input sequence to obtain a sentence eigenvector, the sentence eigenvector being the representation of the input sequence.

In certain embodiments, the sentence eigenvector is a vector sequence or a single vector.

In certain embodiments, the electronic device encoding the input sequence to obtain the sentence eigenvector includes the following: the electronic device encodes the input sequence into the vector sequence, the vector sequence including at least one vector.

For example, when the electronic device encodes the input sequence into the vector sequence, word segmentation is first performed on the input sequence to obtain at least one word; and each word obtained by the word segmentation is encoded into a vector to form a vector sequence.

In another embodiment, the electronic device encodes the input sequence into a single vector.

The electronic device may encode the input sequence into a vector by using an encoder. The vector obtained by encoder through encoding includes information about all aspects of the input sequence, such as intent (such as confirmation or query) and specific named entities (such as location and time).

When the electronic device encodes the input sequence into a single vector, subsequent processing on the input sequence is transformed into the processing on the vector. Compared with processing a vector sequence, complexity of the subsequent processing can be greatly reduced, and semantic integrity can be improved by using one vector to represent the input sequence.

When the electronic device uses a vector to represent the input sequence, to express the meaning of the input sequence, a vector with relatively high dimensions may need to be used, such as 5000 dimensions. When a vector sequence is used to represent the input sequence, each vector in the vector sequence only represents one word, and therefore each vector may be a vector with low dimensions.

Step 303. Decode the sentence eigenvector to obtain a first predetermined quantity of candidate sentence sequences.

In certain embodiments, the electronic device decodes the sentence eigenvector to obtain a first predetermined quantity of candidate sentence sequences. The candidate sentence sequence includes at least one decoded word.

The first predetermined quantity is a preset number. In certain embodiments, a first predetermined number is customized by a user, or is set by default in a terminal. For example, the first predetermined quantity is 16 or 24.

Because an output sequence is generated verbatim, a generation process of the output sequence includes a plurality of times of decoding processing, and each decoding processing includes decoding, clustering, and screening.

In certain embodiments, in this embodiment of the present disclosure, the decoding is also referred to as reorganization and extension, that is, the decoding process is to extend decoded words based on a second predetermined quantity of candidate sentence sequences, and reorganize the extended decoded words and the second predetermined quantity of candidate sentence sequences to obtain the first predetermined quantity of candidate sentence sequences. The first predetermined quantity is greater than the second predetermined quantity.

The clustering includes a process of clustering the first predetermined quantity of candidate sentence sequences obtained after the decoding to obtain sentence sequence sets of at least two types.

The screening includes a process of screening out a second predetermined quantity of candidate sentence sequences from the sentence sequence sets of at least two types obtained after the clustering.

Step 304. Cluster the first predetermined quantity of candidate sentence sequences to obtain sentence sequence sets of at least two types.

In certain embodiments, the electronic device clusters the first predetermined quantity of candidate sentence sequences to obtain sentence sequence sets of at least two types. The sentence sequence set includes at least one candidate sentence sequence.

In certain embodiments, the sentence sequence sets of at least two types correspond to different sentence feature types.

In certain embodiments, the sentence feature type is used for indicating sentence grammaticality of the candidate sentence sequence and/or association between the candidate sentence sequence and the input sequence.

Step 305. Screen out a second predetermined quantity of candidate sentence sequences from the sentence sequence sets of at least two types, the second predetermined quantity of candidate sentence sequences including at least two sentence feature types, the second predetermined quantity being less than the first predetermined quantity.

In certain embodiments, the electronic device screens out a second predetermined quantity of candidate sentence sequences from the sentence sequence sets of at least two types.

In certain embodiments, for the sentence sequence set of each type in the sentence sequence sets of at least two types, the electronic device screens out at least one candidate sentence sequence from the sentence sequence set, to form the second predetermined quantity of candidate sentence sequences.

Step 306. Determine an output sequence corresponding to the input sequence according to the second predetermined quantity of candidate sentence sequences.

In certain embodiments, the electronic device selects a candidate sentence sequence from the second predetermined quantity of candidate sentence sequences as the output sequence corresponding to the input sequence.

In certain embodiments, the electronic device selects a candidate sentence sequence from the second predetermined quantity of candidate sentence sequences according to a predetermined selection policy or randomly, to be the output sequence corresponding to the input sequence. This is not limited in this embodiment.

Based on the above, in the embodiments of the present disclosure, an input sequence is encoded to obtain a sentence eigenvector, the sentence eigenvector is decoded to obtain a first predetermined quantity of candidate sentence sequences, and the first predetermined quantity of candidate sentence sequences are clustered and screened to obtain a second predetermined quantity of candidate sentence sequences. Because the second predetermined quantity of candidate sentence sequences obtained through clustering and screening include at least two sentence feature types, an output sequence determined according to the second predetermined quantity of candidate sentence sequences has higher diversity, thereby effectively meeting needs of a user, and improving a sentence generation effect.

Figure 4:
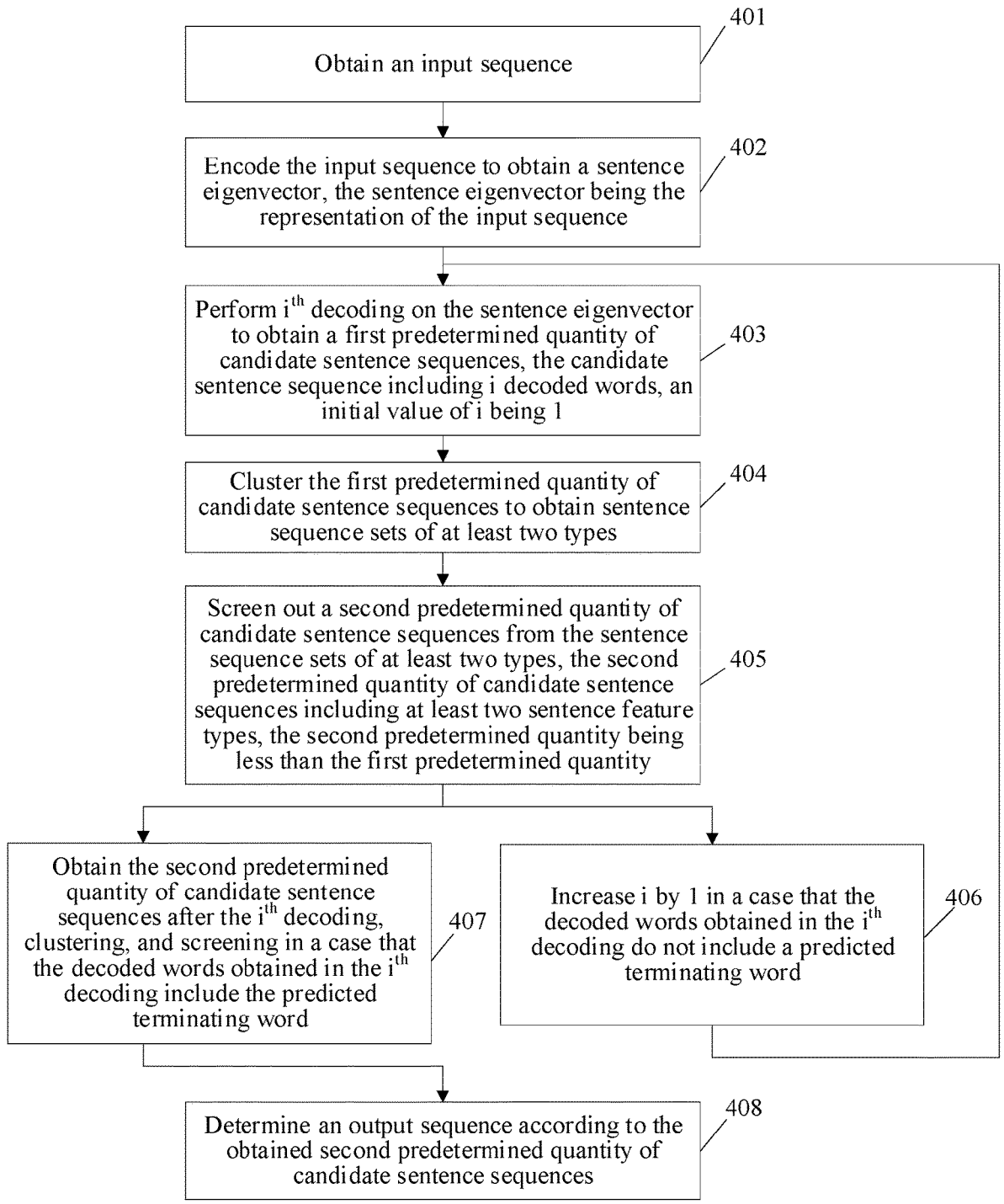
FIG. 4 is a flowchart of a sentence generation method according to one or more embodiments of the present disclosure.

FIG. 4 is a flowchart of a sentence generation method according to another exemplary embodiment of the present disclosure. The method may be implemented by using the electronic device in the foregoing application scenario. Referring to FIG. 4, the sentence generation method includes the following steps:

Step 401. Obtain an input sequence.

In certain embodiments, the electronic device obtains an inputted sentence through a first application program, and generates the input sequence according to the inputted sentence.

Step 402. Encode the input sequence to obtain a sentence eigenvector, the sentence eigenvector being the representation of the input sequence.

For the process of the electronic device encoding the input sequence to obtain the sentence eigenvector, reference may be made to the related details in the foregoing embodiment, and details are not described herein.

Step 403. Perform $i^{th}$ decoding on the sentence eigenvector to obtain a first predetermined quantity of candidate sentence sequences, the candidate sentence sequence including i decoded words, an initial value of i being 1.

In certain embodiments, the electronic device performs first decoding on the sentence eigenvector to obtain a second predetermined quantity of candidate sentence sequences. Each candidate sentence sequence includes one decoded word.

In certain embodiments, when i is greater than 1, the electronic device performs $i^{th}$ decoding on the sentence eigenvector to obtain a second predetermined quantity of candidate sentence sequences, including: performing reorganization and extension in the $i^{th}$ decoding according to the sentence eigenvector and a second predetermined quantity of candidate sentence sequences obtained in $(i-1)^{th}$ decoding, to obtain a first predetermined quantity of candidate sentence sequences. The first predetermined quantity is greater than the second predetermined quantity.

In certain embodiments, in the $i^{th}$ decoding, for at least one candidate sentence sequence in the second predetermined quantity of candidate sentence sequences obtained in the $(i-1)^{th}$ decoding, the electronic device performs reorganization and extension on the candidate sentence sequence to obtain a plurality of extended candidate sentence sequences.

In certain embodiments, the first predetermined quantity is a preset number greater than the second predetermined quantity. For example, the first predetermined quantity is m times the second predetermined quantity, and m is a positive integer greater than 1.

Step 404. Cluster the first predetermined quantity of candidate sentence sequences to obtain sentence sequence sets of at least two types.

Before the electronic device clusters the first predetermined quantity of candidate sentence sequences to obtain sentence sequence sets of at least two types, the method may further include: deduplicating the first predetermined quantity of candidate sentence sequences, the deduplicating being used for removing repeated words in the candidate sentence sequences.

In certain embodiments, the electronic device clusters the first predetermined quantity of candidate sentence sequences to obtain sentence sequence sets of at least two types, including: clustering the first predetermined quantity of candidate sentence sequences by using a designated clustering algorithm to obtain the sentence sequence sets of at least two types.

The designated clustering algorithm includes at least one of a K-means clustering algorithm, a mean shift clustering algorithm, a density-based clustering algorithm, an expectation maximization clustering algorithm with a Gaussian mixture model, and an agglomerative hierarchical clustering algorithm.

This embodiment does not limit the type of the designated clustering algorithm used by a terminal. The designated clustering algorithm being a K-means clustering algorithm is used as an example for description.

The sentence sequence sets of at least two types correspond to different sentence feature types.

In certain embodiments, the sentence feature type is used for indicating sentence grammaticality of the candidate sentence sequence and/or association between the candidate sentence sequence and the input sequence.

In certain embodiments, the sentence feature types include at least one of a first sentence feature type, a second sentence feature type, and a third sentence feature type.

The first sentence feature type is used for indicating that the candidate sentence sequence is a safe output sequence. The safe output sequence is also referred to as a grammatical and safe output sequence. That is, the sentence grammaticality of the candidate sentence sequence is greater than a grammaticality threshold, and the association between the candidate sentence sequence and the input sequence is less than or equal to an association threshold.

The second sentence feature type is used for indicating that the candidate sentence sequence is an ungrammatical output sequence, that is, the sentence grammaticality of the candidate sentence sequence is less than or equal to the grammaticality threshold.

The third sentence feature type is used for indicating that the candidate sentence sequence is a grammatical and pertinent output sequence, that is, the sentence grammaticality of the candidate sentence sequence is greater than the grammaticality threshold, and the association between the candidate sentence sequence and the input sequence is greater than the association threshold.

In certain embodiments, the grammaticality threshold or the association threshold is customized by a user, or is set by default in a terminal. This is not limited in this embodiment.

The sentence feature types used by the electronic device during clustering and the quantity of sentence sequence sets obtained after the clustering may be adjusted, and are not limited in this embodiment.

For example, the sentence sequence sets of at least two types include sentence sequence sets of three types, a first-type sentence sequence set includes a plurality of candidate sentence sequences with a first sentence feature type, and the first sentence feature type is used for indicating that the candidate sentence sequence is a safe sentence sequence; a second-type sentence sequence set includes a plurality of candidate sentence sequences with a second sentence feature type, and the second sentence feature type is used for indicating that the candidate sentence sequence is an ungrammatical sentence sequence; and a third-type sentence sequence set includes a plurality of candidate sentence sequences with a third sentence feature type, and the third sentence feature type is used for indicating that the candidate sentence sequence is a grammatical and pertinent sentence sequence.

Step 405. Screen out a second predetermined quantity of candidate sentence sequences from the sentence sequence sets of at least two types, the second predetermined quantity of candidate sentence sequences including at least two sentence feature types, the second predetermined quantity being less than the first predetermined quantity.

In certain embodiments, the electronic device screens out a second predetermined quantity of candidate sentence sequences from the sentence sequence sets of at least two types, including: sorting, for the sentence sequence set of each type in the sentence sequence sets of at least two types, a plurality of candidate sentence sequences in the sentence sequence set; and obtaining front N candidate sentence sequences in the sentence sequence set after sorting, N being a positive integer.

In certain embodiments, the electronic device sorts, for the sentence sequence set of each type in the sentence sequence sets of at least two types, a plurality of candidate sentence sequences in the sentence sequence set according to a predetermined indicator. For example, the predetermined indicator includes an information entropy.

In certain embodiments, after obtaining sentence sequence sets of K types by clustering, the electronic device obtains the front N candidate sentence sequences from sentence sequence set of each type in the sentence sequence sets of K types after sorting, to obtain K*N candidate sentence sequences, K*N being the second predetermined quantity.

Step 406. Increase i by 1 when or in response to determining that decoded words obtained in the $i^{th}$ decoding do not include a predicted terminating word, to continue to perform the step of performing $i^{th}$ decoding on the sentence eigenvector to obtain the first predetermined quantity of candidate sentence sequences.

In certain embodiments, the predicted terminating word is a keyword for terminating the decoding. For example, the terminating word is "end".

When the decoded words obtained in the $i^{th}$ decoding do not include a predicted terminating word, the electronic device uses the second predetermined quantity of candidate sentence sequences obtained in the $i^{th}$ decoding (that is, the second predetermined quantity of candidate sentence sequences obtained through the $i^{th}$ decoding, clustering, and screening) as an input of next decoding (that is, decoding after the current decoding), and sets new i to i+1, to continue to perform the foregoing steps 403 to 405.

Step 407. Obtain the second predetermined quantity of candidate sentence sequences after the $i^{th}$ decoding, clustering, and screening when or in response to determining that the decoded words obtained in the $i^{th}$ decoding include the predicted terminating word.

When the decoded words obtained in the $i^{th}$ decoding include the predicted terminating word, the electronic device obtains the second predetermined quantity of candidate sentence sequences after the $i^{th}$ decoding, clustering, and screening, and performs step 408.

Step 408. Determine an output sequence according to the obtained second predetermined quantity of candidate sentence sequences.

It is to be understood that the second predetermined quantity of candidate sentence sequences in step 408 are obtained after steps 404 and 405 are performed on the first predetermined quantity of candidate sentence sequences obtained in the last decoding.

In certain embodiments, the electronic device determines an output sequence according to the obtained second predetermined quantity of candidate sentence sequences, including: obtaining a sentence scoring model, the sentence scoring model being used for representing a sentence evaluation rule obtained by training based on sample sentence sequences; inputting each candidate sentence sequence in the second predetermined quantity of candidate sentence sequences into the sentence scoring model to obtain a sentence score, the sentence score being used for indicating sentence quality of the candidate sentence sequence; and determining the output sequence according to the sentence scores corresponding to the second predetermined quantity of candidate sentence sequences.

In certain embodiments, the sentence scoring model is a model obtained by training a neural network based on the sample sentence sequences. The sentence scoring model is used for measuring sentence quality of a sentence sequence. For example, the sentence quality includes sentence grammaticality.

In certain embodiments, the sentence scoring model is used for measuring whether a sentence sequence is a natural language.

When the electronic device is a terminal, the sentence scoring model may be pre-trained and stored by the terminal, or may be sent to the terminal after pre-trained by a server.

When the electronic device is a server, the sentence scoring model is pre-trained by the server and stored in the server. This is not limited in this embodiment. The server training the sentence scoring model is used as an example below to introduce a model training process.

The process of the server training the sentence scoring model includes: obtaining a training sample set, the training sample set including at least one sample data set; and training the at least one sample data set by using an error back propagation algorithm to obtain the sentence scoring model. Each sample data set includes: a sample sentence sequence and a pre-marked correct sentence score.

The server trains the at least one sample data set by using an error back propagation algorithm to obtain the sentence scoring model, including, but not limited to, the following steps:

1. For each sample data set in the at least one sample data set, the sample sentence sequence is inputted into an original parameter model to obtain a training result.

In certain embodiments, the original parameter model is built according to a neural network model. For example, the original parameter model includes, but is not limited to, at least one of a CNN model, a DNN model, an RNN model, an embedding model, a GBDT model, and an LR model.

For example, for each sample data set, the server creates an input and output pair corresponding to the sample data set, an input parameter of the input and output pair is the sample sentence sequence in the sample data set, and an output parameter is the correct sentence score in the sample data set; and the server inputs the input parameter into the original parameter model to obtain the training result.

For example, the sample data set includes a sample sentence sequence A and a correct sentence score "sentence score 1", and an input and output pair created by a terminal is: (sample sentence sequence A)→(sentence score 1), where (sample sentence sequence A) is the input parameter, and (sentence score 1) is the output parameter.

In certain embodiments, the input and output pair is represented by an eigenvector.

2. For each sample data set, the training result is compared with the correct sentence score to obtain a calculation loss, the calculation loss being used for indicating an error between the training result and the correct sentence score.

In certain embodiments, the calculation loss is represented by cross-entropy.

In certain embodiments, the terminal calculates the calculation loss H(p, q) by using the following formula:

$$H(p, q) = -\sum_x p(x) \log q(x)$$

where p(x) and q(x) are discrete distribution vectors having an equal length, p(x) represents a training result, q(x) represents an output parameter, and x is a vector in the training result or the output parameter.

3. According to the calculation loss corresponding to the at least one sample data set, the sentence scoring model is obtained through training by using the error back propagation algorithm.

In certain embodiments, the terminal determines a gradient direction of the sentence scoring model according to the calculation loss through the back propagation algorithm, and updates the model parameters in the sentence scoring model forward layer by layer from an output layer of the sentence scoring model.

In certain embodiments, for each candidate sentence sequence in the second predetermined quantity of candidate sentence sequences, the electronic device inputs the candidate sentence sequence into the sentence scoring model for calculation to obtain the sentence score.

The sentence scoring model is obtained through training according to the at least one sample data set, and each sample data set includes: a sample sentence sequence and a pre-marked correct sentence score.

In certain embodiments, the sentence score is used for indicating sentence quality of the candidate sentence sequence. For example, the sentence quality includes sentence fluency.

In certain embodiments, the sentence score and the sentence quality of the candidate sentence sequence have a negative correlation, that is, a lower sentence score indicates higher sentence quality and higher sentence fluency of the candidate sentence sequence; and higher sentence score indicates lower sentence quality and lower sentence fluency of the candidate sentence sequence.

In certain embodiments, when the sentence score of the candidate sentence sequence is less than a score threshold, the sentence score is used for indicating that the candidate sentence sequence is a natural sentence.

The score threshold is customized by a user, or is set by default in a terminal, and this is not limited in this embodiment.

In certain embodiments, when the sentence score and the sentence quality of the candidate sentence sequence have a negative correlation, the electronic device determines a lowest sentence score in the sentence scores corresponding to the second predetermined quantity of candidate sentence sequences; and determines a candidate sentence sequence corresponding to the lowest sentence score as the output sequence.

In certain embodiments, after the electronic device generates the output sequence, the input sequence and the corresponding output sequence are displayed on the electronic device.

For example, the algorithm corresponding to the sentence generation method provided in the foregoing embodiments is as follows:

---

Input: Beam size BS, Candidates C initialized with
    start symbol
Output: Final response rsp
Data: Language model threshold $lm_{th}$
while Number of completed hypothesis does not
reach BS or maximum decoding step is not reached
do
    for i in BS do
        tmpHyps=Top-N(Extend(C[i]), BS×2);
        Remove hyps in tmpHups with repeated
        N-grams or UNK;
        Save tmpHyps to extended candidates;
    end
    Perform K-means over extended candidates;
    for candidates in each cluster do
        Sort candidates by partial log-prob in R;
        Choose top BS/K candidates;
    Put candidates with end symbol in R;
    Put incomplete candidates in $C_{new}$;
    end
    C ← $C_{new}$
end
Sort R according to log-prob scores;
for hyp in R do
    if socre$_{lm}$(hyp)<$lm_{th}$ then
        rsp ← hyp;
        break;
    end
end

--- where BS is the second predetermined quantity, C includes the sentence eigenvector corresponding to the input sequence, rsp is used for representing the output sequence, socre$_{lm}$(hyp) is the sentence score, $lm_{th}$ is the score threshold, hyp is used for representing the candidate sentence sequence, K is the quantity of the sentence sequence sets, R is used for representing a set of the candidate sentence sequences, and K-means is used for representing the K-means clustering algorithm.

Figure 5:
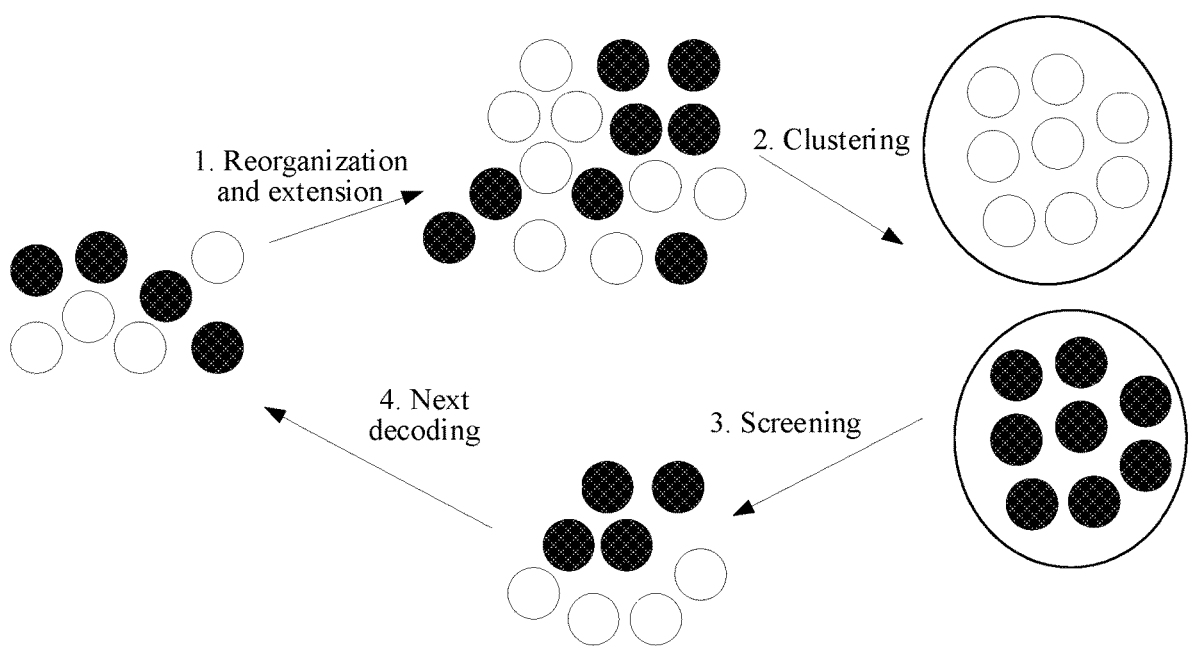
FIG. 5 is a schematic diagram of a principle of a sentence generation method according to one or more embodiments of the present disclosure.

In an exemplary example, the electronic device obtains an input sequence a, and encodes the input sequence a to obtain a sentence eigenvector A. The electronic device performs first decoding on the sentence eigenvector A to obtain eight candidate sentence sequences. FIG. 5 shows a process of second decoding of the electronic device. White circles represent candidate sentence sequences with a first sentence feature type (such as safe candidate sentence sequences), and black circles represent candidate sentence sequences with a second sentence feature type (such as grammatical and pertinent candidate sentence sequences). 1. The electronic device performs reorganization and extension according to the sentence eigenvector and the eight candidate sentence sequences obtained through the first decoding to obtain 16 candidate sentence sequences. 2. The electronic device clusters the 16 candidate sentence sequences to obtain sentence sequence sets of two types, that is, a first-type sentence sequence set and a second-type sentence sequence set, the first-type sentence sequence set includes eight safe candidate sentence sequences, and the second-type sentence sequence set includes eight grammatical and pertinent candidate sentence sequences. 3. The electronic device screens out four safe candidate sentence sequences from the first-type sentence sequence set, and screens out four grammatical and pertinent candidate sentence sequences from the second-type sentence sequence set, to obtain eight candidate sentence sequences. 4. The electronic device performs next decoding according to the obtained eight candidate sentence sequences, until a designated end condition is received. For the next decoding, reference may be made to the foregoing process of the second decoding.

Based on the above, in the embodiments of the present disclosure, the electronic device obtains a sentence scoring model, inputs each candidate sentence sequence in the second predetermined quantity of candidate sentence sequences into the sentence scoring model to obtain a sentence score, and generates an output sequence based on the sentence scores respectively corresponding to the plurality of candidate sentence sequences. The sentence scoring model is used for representing a sentence evaluation rule obtained by training based on sample sentence sequences, so that the determined sentence score can accurately reflect the sentence quality of the candidate sentence sequence, thereby ensuring the sentence quality of the generated output sequence.

Figure 6:
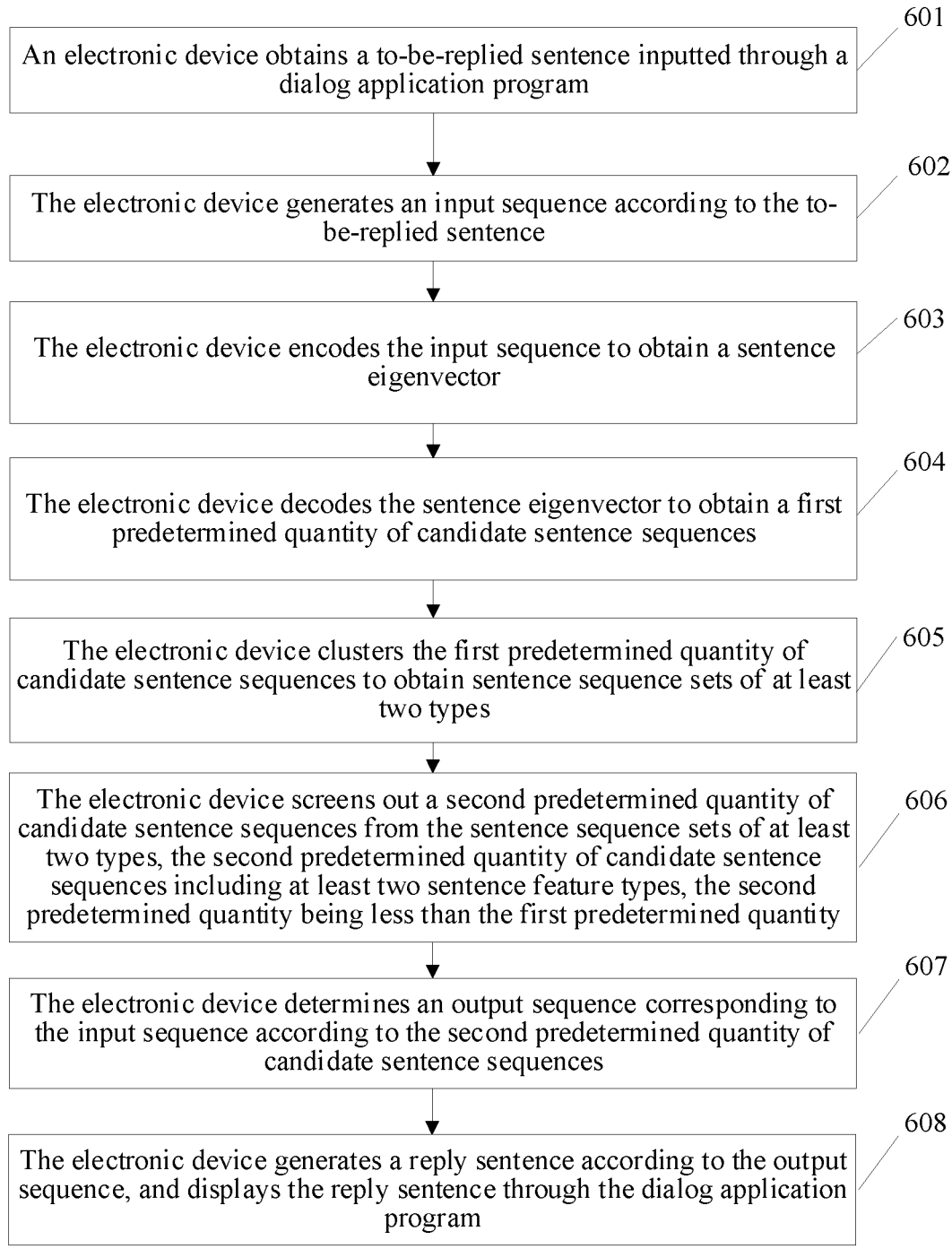
FIG. 6 is a flowchart of a sentence generation method according to one or more embodiments of the present disclosure.

When the foregoing sentence generation method is applied to a dialog system, referring to FIG. 6, the sentence generation method includes the following steps:

Step 601. An electronic device obtains a to-be-replied sentence inputted through a dialog application program.

In certain embodiments, when the dialog application program runs in the foreground, the to-be-replied sentence inputted in a form of voice or text is received.

The dialog application program is an application program that has a human-computer interaction function and that is installed in the electronic device. In certain embodiments, the dialog application program is used for replying to the inputted to-be-replied sentence.

Step 602. The electronic device generates an input sequence according to the to-be-replied sentence.

In certain embodiments, when the to-be-replied sentence is inputted in a form of text, the to-be-replied sentence is determined as the input sequence.

In another embodiment, when the to-be-replied sentence is inputted in a form of voice, the to-be-replied sentence is converted into text data by using a voice recognition algorithm, and the converted text data is determined as the input sequence.

Step 603. The electronic device encodes the input sequence to obtain a sentence eigenvector.

Step 604. The electronic device decodes the sentence eigenvector to obtain a first predetermined quantity of candidate sentence sequences.

Step 605. The electronic device clusters the first predetermined quantity of candidate sentence sequences to obtain sentence sequence sets of at least two types.

Step 606. The electronic device screens out a second predetermined quantity of candidate sentence sequences from the sentence sequence sets of at least two types, the second predetermined quantity of candidate sentence sequences including at least two sentence feature types, the second predetermined quantity being less than the first predetermined quantity.

Step 607. The electronic device determines an output sequence corresponding to the input sequence according to the second predetermined quantity of candidate sentence sequences.

For the process of the electronic device performing steps 603 to 607, reference may be made to the related details in the foregoing embodiment, and details are not described herein.

Step 608. The electronic device generates a reply sentence according to the output sequence, and displays the reply sentence through the dialog application program.

In certain embodiments, the electronic device determines the output sequence as the reply sentence, and displays the reply sentence in a form of text or voice on a dialog interface of the dialog application program.

Figure 7:
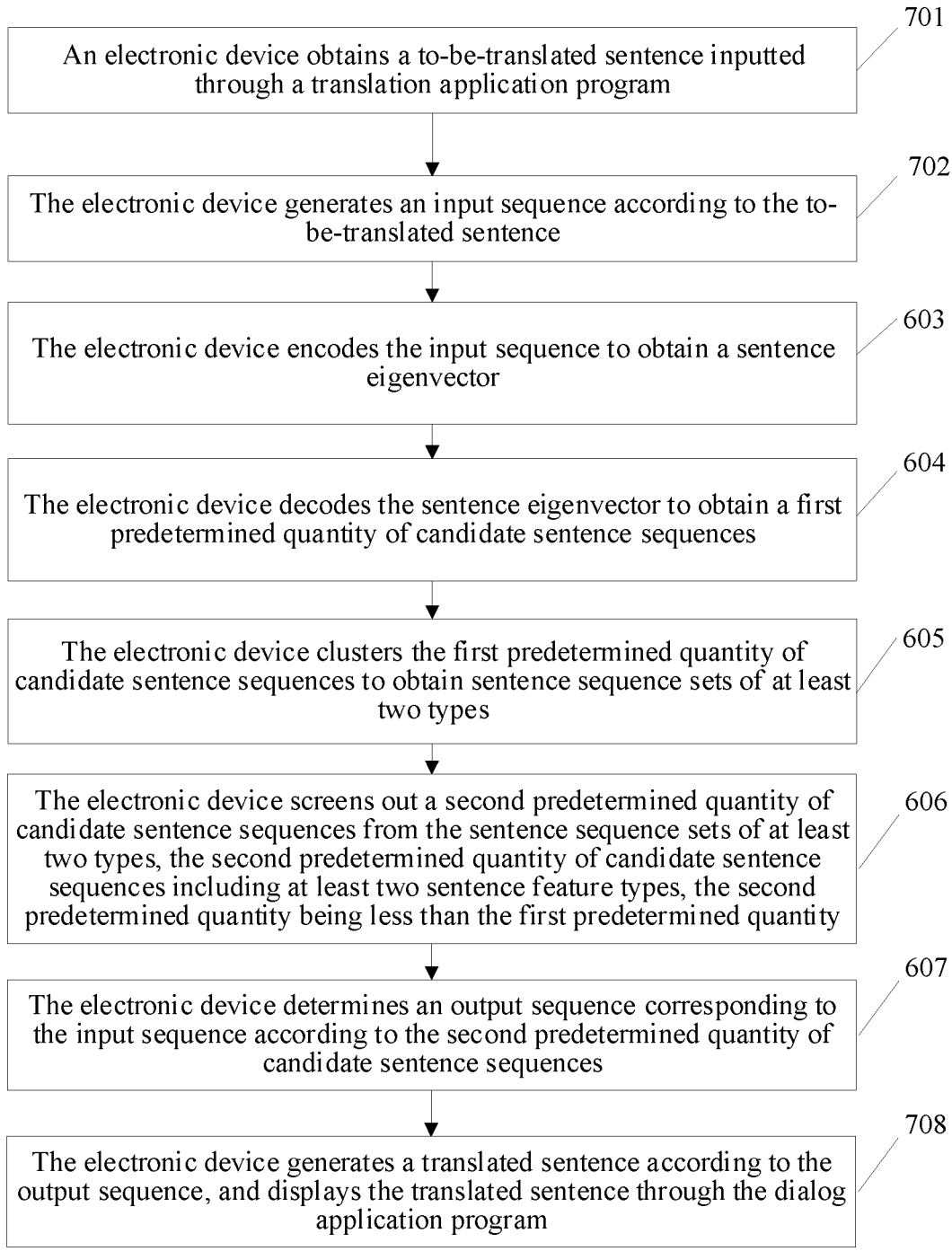
FIG. 7 is a flowchart of a sentence generation method according to one or more embodiments of the present disclosure.

When the foregoing sentence generation method is applied to a machine translation system, referring to FIG. 7, the foregoing steps 601 and 602 may be replaced with the following steps:

Step 701. An electronic device obtains a to-be-translated sentence inputted through a translation application program.

In certain embodiments, when the translation application program runs in the foreground, the to-be-translated sentence inputted in a form of voice or text is received.

The translation application program is an application program that has a translation function and that is installed in the electronic device. In certain embodiments, the translation application program is used for translating the inputted to-be-translated sentence.

The to-be-translated sentence is a to-be-translated sentence of a first language type.

Step 702. The electronic device generates an input sequence according to the to-be-translated sentence.

In certain embodiments, when the to-be-translated sentence is inputted in a form of text, the to-be-translated sentence is determined as the input sequence.

In another embodiment, when the to-be-translated sentence is inputted in a form of voice, the to-be-translated sentence is converted into text data by using a voice recognition algorithm, and the converted text data is determined as the input sequence.

Corresponding, the foregoing step 608 may be replaced with the following step:

Step 708. The electronic device generates a translated sentence according to the output sequence, and displays the translated sentence through the dialog application program.

The translated sentence is a translated sentence of a second language type corresponding to the to-be-translated sentence of the first language type, and the first language type is different from the second language type. For example, the first language type is English, and the second language type is Chinese.

In certain embodiments, the electronic device determines the output sequence as the translated sentence, and displays the translated sentence in a form of text or voice on a translation interface of the translation application program.

When the sentence generation method is applied to a question answering system, an automatic writing system, or a reading comprehension system, a person skilled in the art may refer to the foregoing related steps when the sentence generation method is applied to the dialog system or the machine translation system, and details are not described herein.

A system used for implementing the sentence generation method in the embodiments of the present disclosure wins the first place in 7th Dialog System Technology Challenge (DSTC7). The specific data is shown in Table 1 and Table 2. Table 1 shows automated evaluation results. Table 2 shows manual evaluation results.

TABLE 1

| Name | NIST-4 | BLEU-4 | Meteor | Entropy-4 | Div-1 | Div-2 | Average length |
|---|---|---|---|---|---|---|---|
| Baseline (constant) | 0.184 | 2.87% | 7.48% | 1.609 | 0.000 | 0.000 | 8 |
| Baseline (random) | 1.637 | 0.86% | 5.91% | 10.467 | 0.160 | 0.647 | 19.192 |
| Baseline (seq2seq) | 0.916 | 1.82% | 6.96% | 5.962 | 0.014 | 0.048 | 10.604 |
| Team C/E | 1.515 | 1.32% | 6.43% | 7.639 | 0.053 | 0.171 | 12.674 |
| Team G | 2.040 | 1.05% | 7.48% | 10.057 | 0.108 | 0.449 | 22.336 |
| Our system-K means | 2.523 | 1.83% | 8.07% | 9.030 | 0.109 | 0.325 | 15.133 |
| Our system without K means | 1.771 | 1.94% | 7.64% | 8.194 | 0.094 | 0.267 | 12.770 |
| Human | 2.650 | 3.13% | 8.31% | 10.445 | 0.167 | 0.670 | 18.757 |

In Table 1, there are a total of 2208 test samples. The organizers of DSTC7 provide three baselines (control groups): (1) constant: always answer: "I don't know what you mean."; (2) random: randomly select an answer from training data; and (3) seq2seq (sequence to sequence): use a Vanilla Keras sequence to sequence model for training. Team C/E and Team G are the systems used by the other two teams in this competition. For formal evaluation, we submit two systems. One system uses K-means beam search as the main system, and the other system is an auxiliary system that does not use the K-means beam search. In addition, human response is added for comparison. All response outputs are scored using the following indicators. The indicators are NIST (a machine translation evaluation indicator proposed by Dod-dington in 2002), BLEU (proposed by Papineni et al. in 2002), Me-teor (proposed by Denkowski and Lavie in 2014), DIV-1 and DIV-2 (also referred to as distinct-1 and distinct-2) (proposed by Li et al. in 2016), and Entropy 1-4 (proposed by Zhang et al. in 2018).

As shown in Table 1, the system achieves desirable results on certain indicators of NIST-4, BLEU-4, and Meteor. In addition, the use of K-means beam search improves the performance of several main algorithms and several diversity indicators. In terms of average response length, our system produces a longer response than the seq2seq baseline. In addition, compared with the system that does not use the K-means beam search, the system using the K-means beam search has a longer response time. On average, a response time of the human is longer than that of our system, and a response time generated by the G team using 22 tokens on average is even longer. In terms of the ability to output out-of-vocabulary (OOV) words not covered by the front 100 k vocabulary, our system generates 97 and 57 unique OOV words in the submitted test responses by using the K-means beam search and conventional beam search respectively. Compared with the conventional beam search, the K-means beam search can replicate more OOV words.

TABLE 2

| Model | Relevance and appropriateness | | Interest and information | | Total | |
|---|---|---|---|---|---|---|
| | Average score | 95% confidence interval | Average score | 95% confidence interval | Average score | 95% confidence interval |
| Baseline (constant) | 2.60 | (2.560, 2.644) | 2.32 | (2.281, 2.364) | 2.46 | (2.424, 2.500) |
| Baseline (random) | 2.32 | (2.269, 2.371) | 2.35 | (2.303, 2.401) | 2.34 | (2.288, 2.384) |
| Baseline (seq2seq) | 2.91 | (2.858, 2.963) | 2.68 | (2.632, 2.730) | 2.80 | (2.748, 2.844) |
| Team C/E (Second place) | 3.05 | (3.009, 3.093) | 2.77 | (2.735, 2.812) | 2.91 | (2.875, 2.950) |
| Team G (Third place) | 2.82 | (2.771, 2.870) | 2.57 | (2.525, 2.619) | 2.70 | (2.650, 2.742) |
| Our system (First place) | 2.99 | (2.938, 3.042) | 2.87 | (2.822, 2.922) | 2.93 | (2.882, 2.979) |
| Human | 3.61 | (3.554, 3.658) | 3.49 | (3.434, 3.539) | 3.55 | (3.497, 3.596) |

In Table 2, 1 k test samples are carefully selected by the DSTC7 organizers for competition testing, and then the results are evaluated manually. As shown in Table 2, the manual evaluation is conducted from the perspective of the two categories: "relevance and appropriateness" and "interest and information". Compared with the seq2seq baseline, our system significantly exceeds the baseline at the 95% confidence interval level. In addition, compared with the second-place team, our system achieves the best results with the 95% confidence interval in the category of "interests and information". In general, our system ranks first in the competition.

The following describes apparatus embodiments of the present disclosure, which can be used for executing the method embodiments of the present disclosure. For details not disclosed in the apparatus embodiments of the present disclosure, refer to the method embodiments of the present disclosure.

Figure 8:
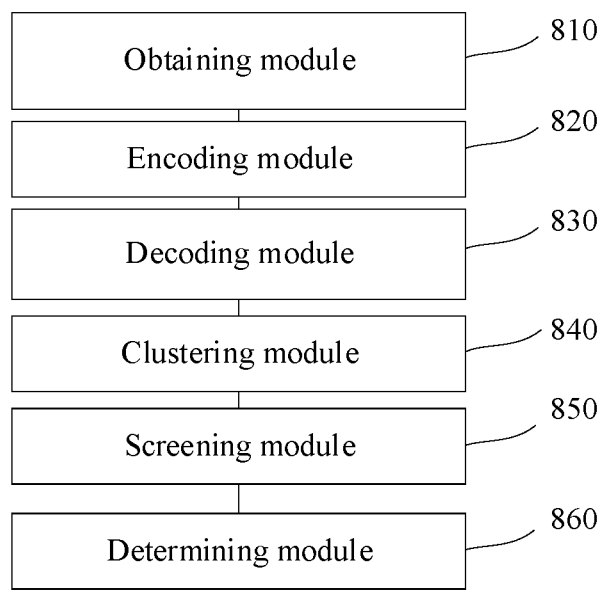
FIG. 8 is a schematic structural diagram of a sentence generation apparatus according to one or more embodiments of the present disclosure.

FIG. 8 is a schematic structural diagram of a sentence generation apparatus according to an exemplary embodiment of the present disclosure. The sentence generation apparatus may be implemented as all or a part of the electronic device in FIG. 1 or FIG. 2 by using a dedicated hardware circuit or a combination of software and hardware. The sentence generation apparatus includes: an obtaining module 810, an encoding module 820, a decoding module 830, a clustering module 840, a screening module 850, and a determining module 860.

The obtaining module 810 is configured to perform the foregoing step 301 or 401.

The encoding module 820 is configured to perform the foregoing step 302 or 402.

The decoding module 830 is configured to perform the foregoing step 303.

The clustering module 840 is configured to perform the foregoing step 304 or 404.

The screening module 850 is configured to perform the foregoing step 305 or 405.

The determining module 860 is configured to perform the foregoing step 306.

In certain embodiments, the decoding module 830 is further configured to perform the foregoing step 403.

The determining module 860 is further configured to perform one of the foregoing steps 406 and 407, and step 408.

In certain embodiments, the clustering module 840 is further configured to cluster the first predetermined quantity of candidate sentence sequences by using a designated clustering algorithm to obtain the sentence sequence sets of at least two types, the sentence sequence sets of at least two types corresponding to different sentence feature types.

The designated clustering algorithm includes at least one of a K-means clustering algorithm, a mean shift clustering algorithm, a density-based clustering algorithm, an expectation maximization clustering algorithm with a Gaussian mixture model, and an agglomerative hierarchical clustering algorithm.

In certain embodiments, the sentence feature types include at least one of a first sentence feature type, a second sentence feature type, and a third sentence feature type.

The first sentence feature type is used for indicating that the candidate sentence sequence is a safe sentence sequence.

The second sentence feature type is used for indicating that the candidate sentence sequence is an ungrammatical sentence sequence.

The third sentence feature type is used for indicating that the candidate sentence sequence is a grammatical and pertinent sentence sequence.

In certain embodiments, the determining module 860 is further configured to obtain a sentence scoring model, the sentence scoring model being used for representing a sentence evaluation rule obtained by training based on sample sentence sequences; input each candidate sentence sequence in the second predetermined quantity of candidate sentence sequences into the sentence scoring model to obtain a sentence score, the sentence score being used for indicating sentence quality of the candidate sentence sequence; and determine the output sequence according to the sentence scores corresponding to the second predetermined quantity of candidate sentence sequences.

In certain embodiments, the sentence score and the sentence quality of the candidate sentence sequence have a negative correlation. The determining module 860 is further configured to determine a lowest sentence score in the sentence scores corresponding to the second predetermined quantity of candidate sentence sequences; and determine a candidate sentence sequence corresponding to the lowest sentence score as the output sequence.

In certain embodiments, the determining module 860 is further configured to obtain a training sample set, the training sample set including at least one sample data set, each sample data set including: a sample sentence sequence and a pre-marked correct sentence score; and train an original parameter model by using an error back propagation algorithm according to the at least one sample data set to obtain the sentence scoring model.

In certain embodiments, the screening module 850 is further configured to sort, for the sentence sequence set of each type in the sentence sequence sets of at least two types, a plurality of candidate sentence sequences in the sentence sequence set; and obtain front N candidate sentence sequences in the sentence sequence set after sorting, N being a positive integer.

In certain embodiments, the apparatus further includes: a deduplicating module. The deduplicating module is configured to deduplicate the first predetermined quantity of candidate sentence sequences, the deduplicating being used for removing repeated words in the candidate sentence sequences.

In certain embodiments, when or in response to determining that the sentence generation method is applied to a dialog system, the input sequence is a to-be-replied sentence, and the output sequence is a reply sentence.

When or in response to determining that the sentence generation method is applied to a machine translation system, the input sequence is a to-be-translated sentence of a first language type, and the output sequence is a translated sentence of a second language type, the first language type being different from the second language type.

When or in response to determining that the sentence generation method is applied to a question answering system, the input sequence is a question sentence, and the output sequence is an answer sentence.

When or in response to determining that the sentence generation method is applied to an automatic writing system, the input sequence is a theme sentence, and the output sequence is a content sentence.

When or in response to determining that the sentence generation method is applied to a reading comprehension system, the input sequence is a topic sentence, and the output sequence is an answer sentence.

In certain embodiments, the obtaining module 810 is further configured to obtain a to-be-replied sentence inputted through a dialog application program; and generate the input sequence according to the to-be-replied sentence.

The apparatus further includes: a display module. The display module is configured to generate a reply sentence according to the output sequence; and display the reply sentence through the dialog application program.

For related details, refer to method embodiments shown in FIG. 3 to FIG. 7. The obtaining module 810 is further configured to implement any other function that is related to an obtaining step and that is implied or disclosed in the foregoing method embodiments. The encoding module 820 is further configured to implement any other function that is related to an encoding step and that is implied or disclosed in the foregoing method embodiments. The decoding module 830 is further configured to implement any other function that is related to a decoding step and that is implied or disclosed in the foregoing method embodiments. The clustering module 840 is further configured to implement any other function that is related to a clustering step and that is implied or disclosed in the foregoing method embodiments. The screening module 850 is further configured to implement any other function that is related to a screening step and that is implied or disclosed in the foregoing method embodiments. The determining module 860 is further configured to implement any other function that is related to a determining step and that is implied or disclosed in the foregoing method embodiments.

When the apparatus provided in the foregoing embodiments implements functions of the apparatus, the division of the foregoing functional modules is merely an example for description. In a practical implementation, the functions may be assigned to and performed by different functional modules according to the requirements, that is, the internal structure of the device is divided into different functional modules, to implement all or some of the functions described above. In addition, the apparatus and method embodiments provided in the foregoing embodiments belong to one conception. For the specific implementation process, reference may be made to the method embodiments, and details are not described herein again.

Figure 9:
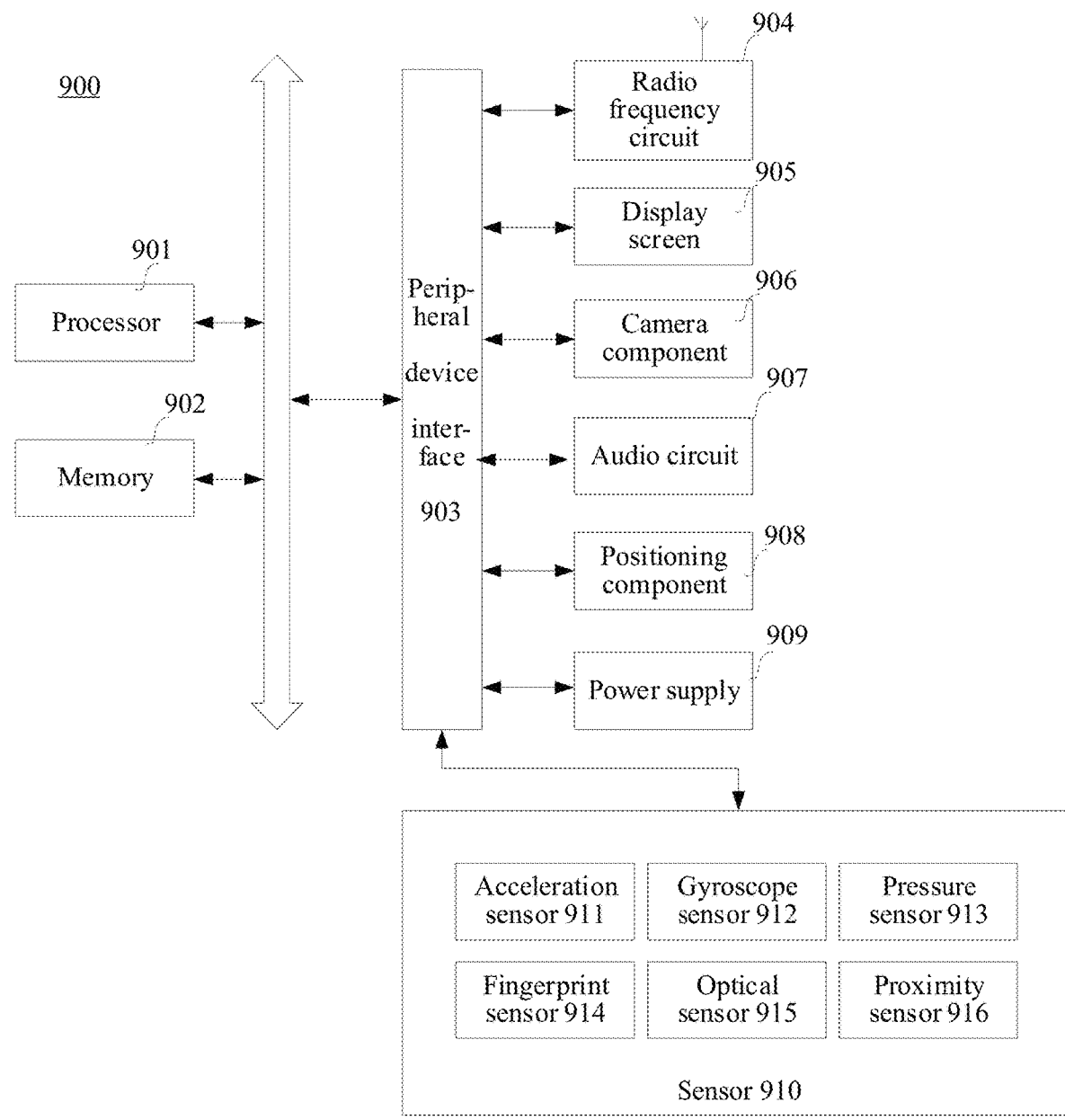
FIG. 9 is a schematic structural diagram of a terminal according to one or more embodiments of the present disclosure.

FIG. 9 is a structural block diagram of a terminal 900 according to an exemplary embodiment of the present disclosure. The terminal 900 may be a smartphone, a tablet computer, a Moving Picture Experts Group Audio Layer III (MP3) player, a Moving Picture Experts Group Audio Layer IV (MP4) player, a notebook computer, or a desktop computer. The terminal 900 may also be referred to as a user equipment, a portable terminal, a laptop terminal, a desktop terminal or the like.

Generally, the terminal 900 includes one or more processors 901 and a memory 902.

The one or more processors 901 may include one or more processing cores, for example, one or more 4-core processors or one or more 8-core processors. The one or more processors 901 may be implemented in at least one of the following hardware form: a digital signal processor (DSP), a field-programmable gate array (FPGA), and a programmable logic array (PLA). The one or more processors 901 may also include one or more main processors and one or more coprocessors. The one or more main processors are one or more processors configured to process data in an awake state, and are also referred to as one or more central processing units (CPUs). The one or more coprocessors are one or more low power consumption processors configured to process data in a standby state. In some embodiments, the one or more processors 901 may be integrated with one or more graphics processing units (GPUs). The GPU is configured to be responsible for rendering and drawing content that a display may need to display. In some embodiments, the one or more processors 901 may further include one or more artificial intelligence (AI) processors. The one or more AI processors are configured to process computing operations related to machine learning.

The memory 902 may include one or more computer-readable storage media. The computer-readable storage medium may be non-transient. The memory 902 may further include a high-speed random access memory and a non-volatile memory, such as one or more magnetic disk storage devices or flash storage devices. In some embodiments, the non-transient computer-readable storage medium in the memory 902 is configured to store at least one computer-readable instruction, and the at least one computer-readable instruction is used for being executed by the one or more processors 901 to implement the sentence generation method provided in the method embodiments of the present disclosure.

In some embodiments, the terminal 900 may alternatively include: a peripheral device interface 903 and at least one peripheral device. The one or more processors 901, the memory 902, and the peripheral device interface 903 may be connected by a bus or a signal line. Each peripheral device may be connected to the peripheral device interface 903 by using a bus, a signal cable, or a circuit board. Specifically, the peripheral device includes at least one of a radio frequency circuit 904, a touch display screen 905, a camera 906, an audio circuit 907, a positioning component 908, and a power supply 909.

The peripheral interface 903 may be configured to connect at least one peripheral related to input/output (I/O) to the one or more processors 901 and the memory 902. In some embodiments, the one or more processors 901, the memory 902 and the peripheral device interface 903 are integrated on a same chip or circuit board. In some other embodiments, any one or two of the one or more processors 901, the memory 902, and the peripheral device interface 903 may be implemented on a single chip or circuit board. This is not limited in this embodiment.

The RF circuit 904 is configured to receive and transmit an RF signal, which is also referred to as an electromagnetic signal.

The display screen 905 is configured to display a user interface (UI). The UI may include a graph, text, an icon, a video, and any combination thereof. When the display screen 905 is a touch display screen, the display screen 905 also has the capability to collect a touch signal on or above a surface of the display screen 905. The touch signal may be inputted to the one or more processors 901 as a control signal for processing. In this case, the display screen 905 may be further configured to provide a virtual button and/or a virtual keyboard, which is also referred to as a soft button and/or a soft keyboard.

The camera component 906 is configured to collect images or videos. Optionally, the camera component 906 includes a front-facing camera and a rear-facing camera. Generally, the front-facing camera is disposed on the front panel of the terminal, and the rear-facing camera is disposed on a back surface of the terminal.

The audio circuit 907 may include a microphone and a speaker. The microphone is configured to collect sound waves of a user and an environment, and convert the sound waves into an electrical signal to input to the one or more processors 901 for processing, or input to the radio frequency circuit 904 for implementing voice communication.

The positioning component 908 is configured to determine a current geographic location of the terminal 900, to implement navigation or a location based service (LBS).

The power supply 909 is configured to supply power to components in the terminal 900. The power supply 909 may be an alternating current, a direct current, a disposable battery, or a rechargeable battery.

In some embodiments, the terminal 900 may further include one or more sensors 910. The one or more sensors 910 include, but are not limited to: an acceleration sensor 911, a gyroscope sensor 912, a pressure sensor 913, a fingerprint sensor 914, an optical sensor 915, and a proximity sensor 916.

The acceleration sensor 911 may detect a magnitude of acceleration on three coordinate axes of a coordinate system established by the terminal 900.

The gyroscope sensor 912 may detect a body direction and a rotation angle of the terminal 900, and may work with the acceleration sensor 911 to acquire a 3D action performed by the user on the terminal 900.

The pressure sensor 913 may be disposed at a side frame of the terminal 900 and/or a lower layer of the touchscreen 905. When the pressure sensor 913 is disposed on the side frame of the terminal 900, a holding signal of the user on the terminal 900 may be detected. The one or more processors 901 perform left and right hand recognition or a quick operation according to the holding signal collected by the pressure sensor 913. When the pressure sensor 913 is disposed at the lower layer of the touch display screen 905, the one or more processors 901 control an operable control on the UI interface according to a pressure operation performed by the user on the touch display screen 905.

The fingerprint sensor 914 is configured to collect a user's fingerprint, and the one or more processors 901 identify a user's identity according to the fingerprint collected by the fingerprint sensor 914, or the fingerprint sensor 914 identifies a user's identity according to the collected fingerprint.

The optical sensor 915 is configured to collect ambient light intensity. In certain embodiments, the one or more processors 901 may control the display brightness of the touch display screen 905 according to the ambient light intensity collected by the optical sensor 915.

The proximity sensor 916, also referred to as a distance sensor, is usually disposed on the front panel of the terminal 900. The proximity sensor 916 is configured to collect a distance between the user and the front face of the terminal 900.

Figure 10:
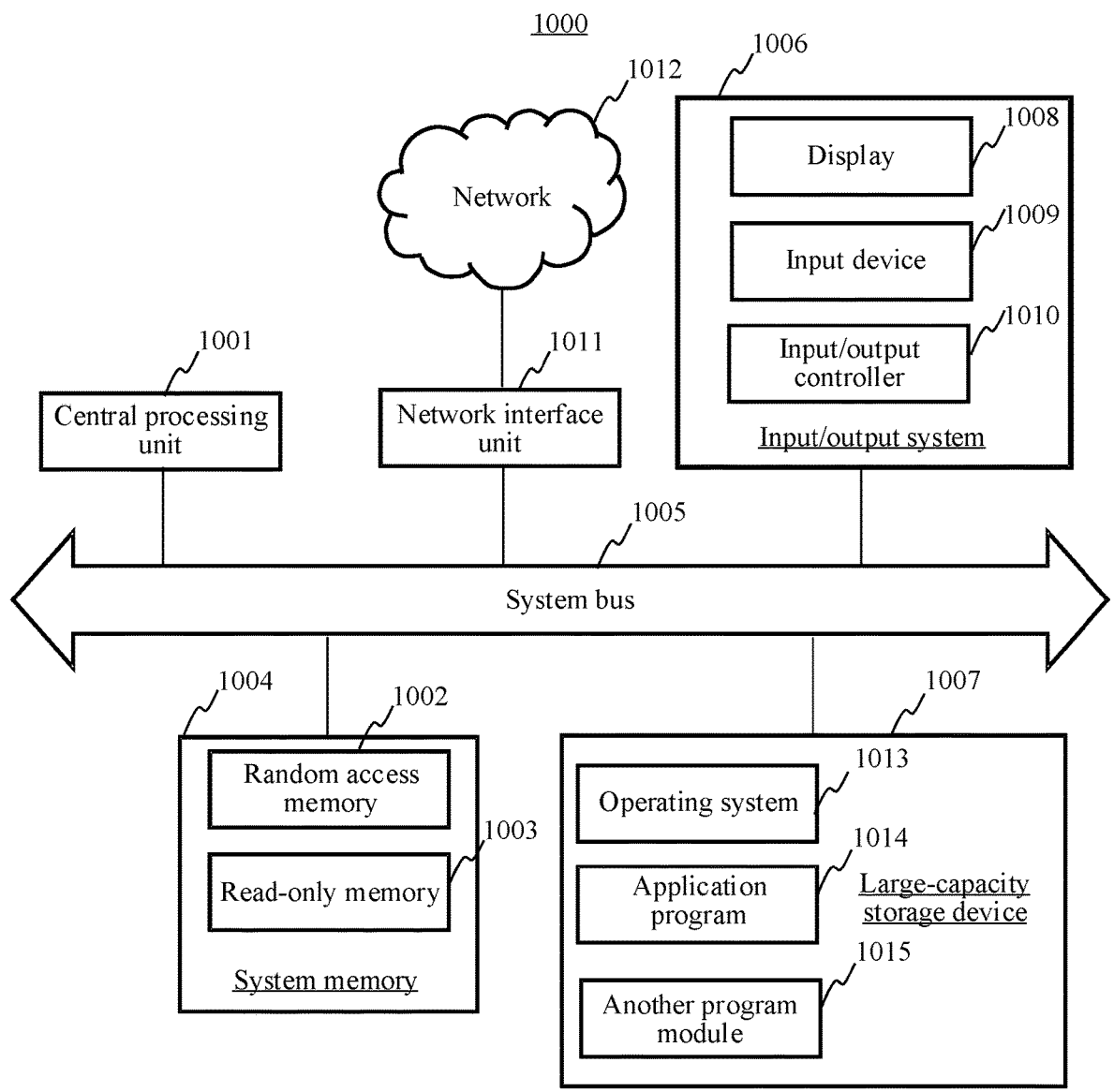
FIG. 10 is a schematic structural diagram of a server according to one or more embodiments of the present disclosure.

A person skilled in the art may understand that the structure shown in FIG. 9 does not constitute a limitation to the terminal 900, and the terminal may include more components or fewer components than those shown in the figure, or some components may be combined, or a different component deployment may be used FIG. 10 is a schematic structural diagram of a terminal 1000 according to an exemplary embodiment of the present disclosure. Specifically, the server 1000 includes a central processing unit (CPU) 1001, a system memory 1004 including a random access memory (RAM) 1002 and a read-only memory (ROM) 1003, and a system bus 1005 connecting the system memory 1004 and the CPU 1001. The server 1000 further includes a basic input/output system (I/O system) 1006 assisting in transmitting information between devices in a computer, and a large-capacity storage device 1007 configured to store an operating system 1013, an application program 1014 and another program module 1015.

The basic I/O system 1006 includes a display 1008 configured to display information and an input device 1009 such as a mouse or a keyboard that is used for inputting information by a user. The display 1008 and the input device 1009 are both connected to the CPU 1001 by using an input/output controller 1010 connected to the system bus 1005. The basic I/O system 1006 may further include the input/output controller 1010 to receive and process inputs from a plurality of other devices such as a keyboard, a mouse, and an electronic stylus. Similarly, the input/output controller 1010 further provides an output to a display screen, a printer or another type of output device.

The mass storage device 1007 is connected to the CPU 1001 by using a mass storage controller (not shown) connected to the system bus 1005. The mass storage device 1007 and a computer readable medium associated with the mass storage device 1007 provide non-volatile storage for the server 1000. That is, the mass storage device 1007 may include the computer-readable medium (not shown) such as a hard disk or a CD-ROI driver.

In general, the computer-readable medium may include a computer storage medium and a communication medium. The computer storage medium includes volatile and non-volatile, removable and non-removable media that are configured to store information such as computer-readable instructions, data structures, program modules, or other data and that are implemented by using any method or technology. The computer storage medium includes a RAM, a ROM, an erasable programmable ROM (EPROM), an electrically erasable programmable ROM (EEPROM), a flash memory or another solid-state memory technology, a CD-ROM, a digital versatile disc (DVD) or another optical memory, a magnetic cassette, a magnetic tape, a magnetic disk memory, or another magnetic storage device. A person skilled in art can know that the computer storage medium is not limited to the foregoing several types. The system memory 1004 and the mass storage device 1007 may be collectively referred to as a memory.

According to various embodiments of the present disclosure, the server 1000 may further be connected, by using a network such as the Internet, to a remote computer on the network and run. That is, the server 1000 may be connected to a network 1012 by using a network interface unit 1011 that is connected to the system bus 1005, or may be connected to a network of another type or a remote computer system (not shown) by using the network interface unit 1011.

In certain embodiments, the memory stores at least one computer-readable instruction, at least one program, a code set, or a computer-readable instruction set, the at least one computer-readable instruction, the at least one program, the code set, or the computer-readable instruction set being loaded and executed by one or more processors to implement the sentence generation method provided in the foregoing method embodiments.

An embodiment of the present disclosure further provides an electronic device, and the electronic device may be the terminal 900 provided in FIG. 9, or may be the server 1000 provided in FIG. 10.

The present disclosure further provides a computer-readable storage medium, the computer-readable storage medium stores at least one computer-readable instruction, and the at least one computer-readable instruction is used for being executed by the one or more processors to implement the sentence generation method provided in the foregoing method embodiments.

The term unit (and other similar terms such as subunit, module, submodule, etc.) in this disclosure may refer to a software unit, a hardware unit, or a combination thereof. A software unit (e.g., computer program) may be developed using a computer programming language. A hardware unit may be implemented using processing circuitry and/or memory. Each unit can be implemented using one or more processors (or processors and memory). Likewise, a processor (or processors and memory) can be used to implement one or more units. Moreover, each unit can be part of an overall unit that includes the functionalities of the unit.

The sequence numbers of the foregoing embodiments of the present disclosure are merely for description purpose but do not imply any particular preference among the embodiments.

A person of ordinary skill in the art may understand that all or some of the steps of the sentence generation method of the foregoing embodiments may be implemented by using hardware, or may be implemented by a program instructing related hardware. The program may be stored in a computer-readable storage medium. The above-mentioned computer-readable storage medium may be a read-only memory, a magnetic disk, an optical disc, or the like.

The foregoing descriptions are merely exemplary embodiments of the present disclosure, and are not intended to limit the implementations of the present disclosure. A person of ordinary skill in the art may conveniently make variations or modifications according to the main idea and spirit of the present disclosure. Therefore, the protection scope of the present disclosure shall be subject to the protection scope of the claims.

What is claimed is:

1. A sentence generation method, performed by a machine translation system, the method comprising:
   obtaining an input sequence, wherein the input sequence is of a first language type;

encoding the input sequence to obtain a sentence eigenvector;

decoding the sentence eigenvector to obtain a first predetermined quantity of candidate sentence sequences;

clustering the first predetermined quantity of candidate sentence sequences to obtain sentence sequence sets of at least two types;

selecting a second predetermined quantity of candidate sentence sequences from the sentence sequence sets of at least two types, the second predetermined quantity of candidate sentence sequences including at least two sentence feature types wherein a first sentence feature type indicates that a sentence grammaticality of the candidate sentence sequence exceeds a grammaticality threshold, a target sentence feature type indicates that the sentence grammaticality of the candidate sentence sequence exceeds the grammaticality threshold and an association between the candidate sentence and the input sentence exceeds an association threshold; and determining an output sequence corresponding to the input sequence according to the second predetermined quantity of candidate sentence sequences, wherein the output sequence is of a second language type.

2. The method according to claim 1, wherein the decoding the sentence eigenvector to obtain the first predetermined quantity of candidate sentence sequences comprises:

performing $i^{th}$ decoding on the sentence eigenvector to obtain the first predetermined quantity of candidate sentence sequences, the candidate sentence sequence including i decoded words, an initial value of i being 1; and after the selecting the second predetermined quantity of candidate sentence sequences from the sentence sequence sets of at least two types, the method further comprises:

using the second predetermined quantity of candidate sentence sequences as an input of $(i+1)^{th}$ decoding, and setting i to i+1, to continue to perform the operation of performing $i^{th}$ decoding on the sentence eigenvector to obtain the first predetermined quantity of candidate sentence sequences, in response to determining that the decoded words obtained in the $i^{th}$ decoding do not include a predicted terminating word; and performing the operation of determining an output sequence corresponding to the input sequence according to the second predetermined quantity of candidate sentence sequences, in response to determining that the decoded words obtained in the $i^{th}$ decoding include the predicted terminating word.

3. The method according to claim 2, wherein the using the second predetermined quantity of candidate sentence sequences as the input of $(i+1)^{th}$ decoding, and setting i to i+1, to continue to perform the operation of performing $i^{th}$ decoding on the sentence eigenvector to obtain the first predetermined quantity of candidate sentence sequences comprises:

performing reorganization and extension in the $i^{th}$ decoding according to the sentence eigenvector and the second predetermined quantity of candidate sentence sequences obtained in decoding prior to the $i^{th}$ decoding, to obtain the first predetermined quantity of candidate sentence sequences.

4. The method according to claim 3, wherein the performing reorganization and extension according to the sentence eigenvector and the second predetermined quantity of candidate sentence sequences obtained in decoding prior to the $i^{th}$ decoding, to obtain the first predetermined quantity of candidate sentence sequences comprises:

extending decoded words based on the second predetermined quantity of candidate sentence sequences obtained in the decoding prior to the $i^{th}$ decoding; and reorganizing the extended decoded words and the second predetermined quantity of candidate sentence sequences to obtain the first predetermined quantity of candidate sentence sequences.

5. The method according to claim 1, wherein the clustering the first predetermined quantity of candidate sentence sequences to obtain sentence sequence sets of at least two types comprises:

clustering the first predetermined quantity of candidate sentence sequences to obtain the sentence sequence sets of at least two types, the sentence sequence sets of at least two types corresponding to different sentence feature types.

6. The method according to claim 1, wherein the sentence feature types include at least one of the first sentence feature type, a second sentence feature type, and the target sentence feature type, and wherein:

the first sentence feature type is used for indicating that the candidate sentence sequence is a safe sentence sequence;

the second sentence feature type is used for indicating that the candidate sentence sequence is an ungrammatical sentence sequence; and the target sentence feature type is used for indicating that the candidate sentence sequence is a grammatical and pertinent sentence sequence.

7. The method according to claim 1, wherein the determining the output sequence corresponding to the input sequence according to the second predetermined quantity of candidate sentence sequences comprises:

obtaining a sentence scoring model, the sentence scoring model being used for representing a sentence evaluation rule obtained by training based on sample sentence sequences;

inputting each candidate sentence sequence in the second predetermined quantity of candidate sentence sequences into the sentence scoring model to obtain a sentence score, the sentence score being used for indicating sentence quality of the candidate sentence sequence; and determining the output sequence according to the sentence scores corresponding to the second predetermined quantity of candidate sentence sequences.

8. The method according to claim 7, wherein the sentence score and the sentence quality of the candidate sentence sequence have a negative correlation; and the determining the output sequence according to the sentence scores corresponding to the second predetermined quantity of candidate sentence sequences comprises:

determining a lowest sentence score in the sentence scores corresponding to the second predetermined quantity of candidate sentence sequences; and determining a candidate sentence sequence corresponding to the lowest sentence score as the output sequence.

9. The method according to claim 7, wherein the obtaining the sentence scoring model comprises:

obtaining a training sample set, the training sample set comprising at least one sample data set, each sample data set comprising: a sample sentence sequence and a pre-marked correct sentence score; and training an original parameter model by using an error back propagation algorithm according to the at least one sample data set to obtain the sentence scoring model.

10. The method according to claim 1, wherein the selecting the second predetermined quantity of candidate sentence sequences from the sentence sequence sets of at least two types comprises:
sorting, for the sentence sequence set of each type in the sentence sequence sets of at least two types, a plurality of candidate sentence sequences in the sentence sequence set; and
obtaining a preset quantity of front candidate sentence sequences in the sentence sequence set after sorting.

11. The method according to claim 1, wherein before the clustering the first predetermined quantity of candidate sentence sequences to obtain sentence sequence sets of at least two types, the method further comprises:
deduplicating the first predetermined quantity of candidate sentence sequences, the deduplicating being used for removing repeated words in the candidate sentence sequences.

12. The method according to claim 1, wherein the obtaining the input sequence comprises:
obtaining a to-be-replied sentence inputted through a dialog application program; and
generating the input sequence according to the to-be-replied sentence; and
the method further comprises:
generating a reply sentence according to the output sequence; and
displaying the reply sentence through the dialog application program.

13. A sentence generation apparatus in a dialog system, the system comprising:
a memory storing computer program instructions; and a processor coupled to the memory and configured to executing the computer program instructions and perform:
obtaining an input sequence, wherein the input sequence is a to-be-replied sentence;
encoding the input sequence to obtain a sentence eigenvector;
decoding the sentence eigenvector to obtain a first predetermined quantity of candidate sentence sequences;
clustering the first predetermined quantity of candidate sentence sequences to obtain sentence sequence sets of at least two types;
selecting a second predetermined quantity of candidate sentence sequences from the sentence sequence sets of at least two types, the second predetermined quantity of candidate sentence sequences comprising at least two sentence feature types wherein a first sentence feature type indicates that a sentence grammaticality of the candidate sentence sequence exceeds a grammaticality threshold, a second sentence feature type indicates that the sentence grammaticality of the candidate sentence sequence is less than or equal to the grammaticality threshold; and
determining an output sequence corresponding to the input sequence according to the second predetermined quantity of candidate sentence sequences, wherein the output sequence is a reply sentence.

14. The sentence generation apparatus according to claim 13, wherein the decoding the sentence eigenvector to obtain the first predetermined quantity of candidate sentence sequences comprises:
performing $i^{th}$ decoding on the sentence eigenvector to obtain the first predetermined quantity of candidate sentence sequences, the candidate sentence sequence including i decoded words, an initial value of i being 1; and
after the selecting the second predetermined quantity of candidate sentence sequences from the sentence sequence sets of at least two types, the method further comprises:
using the second predetermined quantity of candidate sentence sequences as an input of $(i+1)^{th}$ decoding, and setting i to i+1, to continue to perform the operation of performing $i^{th}$ decoding on the sentence eigenvector to obtain the first predetermined quantity of candidate sentence sequences, in response to determining that the decoded words obtained in the $i^{th}$ decoding do not include a predicted terminating word; and
performing the operation of determining an output sequence corresponding to the input sequence according to the second predetermined quantity of candidate sentence sequences, in response to determining that the decoded words obtained in the $i^{th}$ decoding include the predicted terminating word.

15. The sentence generation apparatus according to claim 14, wherein the using the second predetermined quantity of candidate sentence sequences as the input of $(i+1)^{th}$ decoding, and setting i to i+1, to continue to perform the operation of performing $i^{th}$ decoding on the sentence eigenvector to obtain the first predetermined quantity of candidate sentence sequences comprises:
performing reorganization and extension in the $i^{th}$ decoding according to the sentence eigenvector and the second predetermined quantity of candidate sentence sequences obtained in decoding prior to the $i^{th}$ decoding, to obtain the first predetermined quantity of candidate sentence sequences.

16. The sentence generation apparatus according to claim 15, wherein the performing reorganization and extension according to the sentence eigenvector and the second predetermined quantity of candidate sentence sequences obtained in decoding prior to the $i^{th}$ decoding, to obtain the first predetermined quantity of candidate sentence sequences comprises:
extending decoded words based on the second predetermined quantity of candidate sentence sequences obtained in the decoding prior to the $i^{th}$ decoding; and
reorganizing the extended decoded words and the second predetermined quantity of candidate sentence sequences to obtain the first predetermined quantity of candidate sentence sequences.

* * * * *